(12) United States Patent
Carlson et al.

(10) Patent No.: US 6,714,881 B2
(45) Date of Patent: Mar. 30, 2004

(54) TIME REFERENCE COMPENSATION FOR IMPROVED METERING ACCURACY

(75) Inventors: David C. Carlson, Rockvale, TN (US); Michael J. Devaney, Hallsville, MO (US)

(73) Assignee: Square D Company, Palatine, IL (US)

( * ) Notice: Subject to any disclaimer, the term of this patent is extended or adjusted under 35 U.S.C. 154(b) by 22 days.

(21) Appl. No.: 09/929,325

(22) Filed: Aug. 14, 2001

(65) Prior Publication Data

US 2003/0036867 A1 Feb. 20, 2003

(51) Int. Cl.[7] ............................................. G06F 19/00
(52) U.S. Cl. ....................... 702/61; 702/61; 702/125; 702/187; 702/189; 307/3; 307/413; 307/125; 708/405; 708/200; 700/14; 700/22; 324/98; 324/110
(58) Field of Search ............................. 702/57–59, 61, 702/62, 64–66, 69, 71–72, 74–77, 79, 86, 89, 106, 107, 109, 116, FOR 103–111, 134, 135, 138, 141, 154, 168–171; 708/403–409, 231; 307/3, 413, 125, 131; 700/11–14, 22, 28, 44, 52, 75; 324/74, 98, 110

(56) References Cited

U.S. PATENT DOCUMENTS

| | | | | |
|---|---|---|---|---|
| 5,162,723 A | * | 11/1992 | Marzalek et al. | 324/76.19 |
| 5,301,121 A | * | 4/1994 | Garverick et al. | 702/60 |
| 5,696,695 A | * | 12/1997 | Ehlers et al. | 364/492 |
| 5,909,656 A | * | 6/1999 | Yang | 702/77 |
| 6,006,212 A | * | 12/1999 | Schleich et al. | 705/412 |
| 6,262,672 B1 | * | 7/2001 | Brooksby et al. | 340/870.1 |

OTHER PUBLICATIONS

Xi et al., A New Algorithm for Improving the Accuracy of Periodic Signal Analysis, Aug. 1996, IEEE, 4th Edition, vol. 45, pp. 827–830.*

Zhang et al., A New Active Filter for Power Factor Compensation, Jan. 1991, IEEE, pp. 534–538.*

* cited by examiner

Primary Examiner—Marc S. Hoff
Assistant Examiner—Elias Desta
(74) Attorney, Agent, or Firm—Larry I. Golden

(57) ABSTRACT

A method for time reference compensation in a power metering system, the method comprising monitoring a time-dependent characteristic of incoming AC power over a predetermined local time interval, comparing the monitored characteristic over the predetermined local time interval with the expected value of the characteristic based upon the nominal frequency of the AC power, and calculating a correction to one or more of local real-time and time-based measurements of the power metering system, based on the comparing.

16 Claims, 2 Drawing Sheets

TIME REFERENCE COMPENSATION FOR IMPROVED METERING ACCURACY

FIELD OF THE INVENTION

This invention is directed generally to power system control and monitoring, and more particularly to high speed, processor-based sampling of power line waveforms.

BACKGROUND OF THE INVENTION

Frequency deviation of the system clock of a power metering system leads to inaccuracy in time measurement that may result in cumulative errors in time based measurements. Time based measurements include, but are not limited to, energy accumulation, real-time demand allocation and event tagging.

In one important application of the invention, power metering instrumentation for industrial applications may be used to track demand, to achieve optimum power usage versus cost patterns. Typically, power provider charges per kilowatt hour vary with demand, usually by time of day. Presently, many utilities have a dual rate structure including peak and off peak rates. With increasing sophistication, it may be possible for utilities to monitor power usage on a continuous basis, adjusting rates accordingly.

Therefore, it is important, especially for large commercial and/or industrial users to likewise monitor power consumption on an ongoing basis in order to anticipate costs, as well as provide an aid to planning for future power consumption patterns to optimize costs.

Presently, most power metering systems available to consumers are microprocessor-based and use a crystal oscillator time base. These crystal oscillators are typically very precise but exhibit long term measurable deviations from real time. Moreover, the utility-provided power grid typically exhibits some short term fluctuations or variations in the nominal 60 Hz frequency, however, this is self-correcting by the power grid.

Accordingly, the present invention proposes a comparison of the crystal oscillator time base of the consumer power metering instrumentation with the self-correcting 60 Hz frequency of the power grid. If and when variations from the "grid time" are large enough, a correction can be made to the internal clock. Such corrections may be made at regular intervals, such as at the end of a given period, such as peak time and off peak time periods, on a daily basis, or otherwise to correct the "end of period" measurements of time-based quantities such as kilowatt hour usage to compensate for such variations. These corrections may be relatively small on an individual basis, but may accumulate to as much as 1 to 2 percent variation in cost depending on the amount of peak and off-peak power consumption, as well as the allocation of power consumption to peak and off-peak periods, or other variable cost usage patterns or periods as defined by the utility or other provider. For large consumers, even small percentage variations can be significant on a cost basis.

SUMMARY OF THE INVENTION

This invention provides a means to reference the system clock of a metering system to the long-term frequency stability of the power system. The cumulative deviation is measured over time and then used to refine time-dependent measurements such as energy and the real-time clock used for tagging events or allocating demands, etc.

In addition, a reference system based on a Global Positioning Satellite ("GPS") time source or other precision time standard can be used to monitor the same power line source. The common element between the precision time standard and the other meter(s) is power line frequency. Thus, further time corrections or correction factors may be applied to each metering system based on individual system deviations relative to the GPS or some other master standard.

In accordance with one embodiment of the invention, system clock corrections are accomplished by measuring variations of the system clock from the power line/power grid frequency. As noted above, the power line/power grid frequency provides a common time-based standard which is adjusted for long term accuracy.

DETAILED DESCRIPTION OF THE ILLUSTRATED EMBODIMENT

The invention enhances metering performance on real-time dependent measurements and activities such as energy measurement and time dependent demand over uncompensated time bases. These improvements are obtained by the use of a firmware algorithm in the metering systems, the optional addition of a single GPS per metering network, and system software. The described application of the invention is for power line based metering, protection and control systems that rely on an accurate estimate of real-time; however, other systems for sampling quantities having periodic properties may also utilize the invention. Also, the invention may be used for power systems other than 60 Hz, for example 50 Hz systems and 25 Hz systems.

Figure 1:
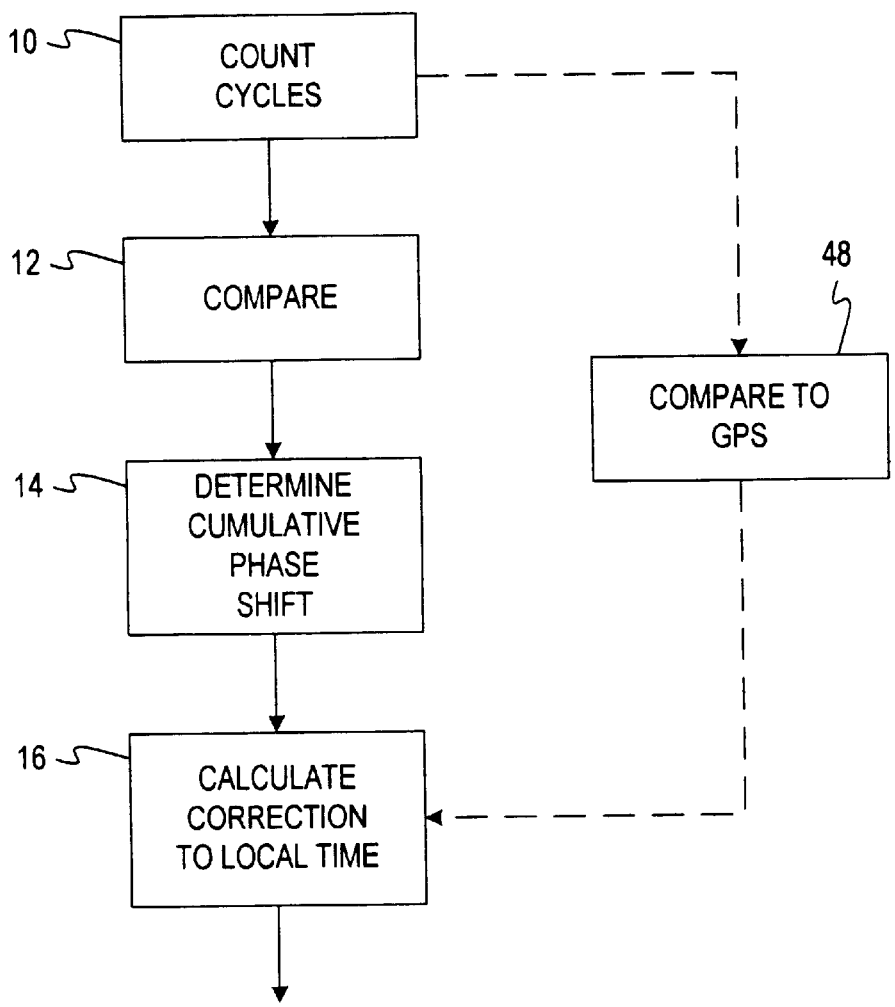
FIG. 1 illustrates one embodiment of the invention.

Referring now to FIG. 1, one embodiment of the invention will be described. Initially, the number of cycles are measured or counted over a predetermined period of time, for example, 24 hours. The cycles of the incoming current from the power grid or power line voltage may deviate from 60 Hz over this time interval. It will be possible to determine a cumulative equivalent phase shift down to a number of degrees, assuming that one degree of phase shift is equivalent to 1/360 cycle. Thus, for example, there should be 3600 "counts" per minute, 216,000 cycles per hour and 5,184,000 cycles per 24 hour period or day. Other time intervals, that is other than 24 hours or one day, may be selected for performing this measurement or count without departing from the invention. Thus, as shown at reference numeral 10, the cycles are counted, and at 12 the count over a given period compared to the expected count over that period as described above. If, for example, over a 24 hour period, the count of cycles is short by 30 cycles, this suggests that there is a variation of approximately ½ second per day which would amount to about 15 seconds per month.

In some power utility systems, demand intervals are 15 minute or quarter hour intervals. Thus, if a correction takes place on the power grid, the expected number of cycles for a given period of time will not be counted. Having determined the number of cycles over or under the expected count, a correction to the local real-time clock can be calculated as indicated at reference numeral 16.

In an alternate method (see FIG. 2), the frequency deviation can be calculated from the sampled power line voltage waveforms using the discrete Fourier transform (DFT) to measure the angular slip of the fundamental over a period of approximately N cycles. The sampling interval for the sampled data is determined from the metering system clock timer system. This system selects the nearest time interval within the timer's resolution for the uniform sampling interval. Deviations from the exact sampling interval are measured as slip in degrees and are converted to a time deviation. Because the power line/power grid frequency is adjusted for long term time accuracy, these time deviations are accumulated over a longer interval, such as 24 hours, and then the resulting time deviation is used to adjust the local real time as well as such time dependent measurements as the energy accumulated during this same interval.

If any outage is detected during this longer interval the local correction is aborted and the central master time reference system is used for the time correction.

The calculation of the frequency deviation is not necessary, however, as one can go directly from the difference to the time correction simply by multiplying the count by the nominal frequency period. That is, (measured cycle counts−expected cycle counts)×cycle period in seconds/cycle=time correction in seconds. Or if 5,183,970 were counted by a meter in its 24 hour day while 5,184,000 is the number expected at 60 Hz and 24 hours the meter is short 30 cycles in 24 hours. Thus the correction is −30×(1/60) seconds/cycle=−½ second. Meter time would then be set back by ½ second. The same percentage correction could then be used to correct the daily energy accumulation and any new peak in the power demand.

Determining the number of cycles over the predetermined local time interval may require some filtering or signal processing of the power system signal.

As a further measure, a GPS (Global Positioning Satellite) time signal may be monitored as a further reference or "referee." Some other precision time standard or source may also be used to compare with the power line source. As indicated at reference numeral 18, comparison to the GPS time standard or other time standard can also be used as a basis for calculating corrections to the local time, that is, as determined by a crystal oscillator or other system "real-time" elements.

In the alternative, or the DFT method (see FIG. 2), the accumulated phase shift is measured over the locally determined observation period using the DFT. This is scaled by a correction term to account for the non-synchronous sampling of the signal. The correction term TC, which results from the granularity of the local time reference, is equal to nominal cycle period/(the number of samples per cycle×the inter-sample interval).

Figure 2:
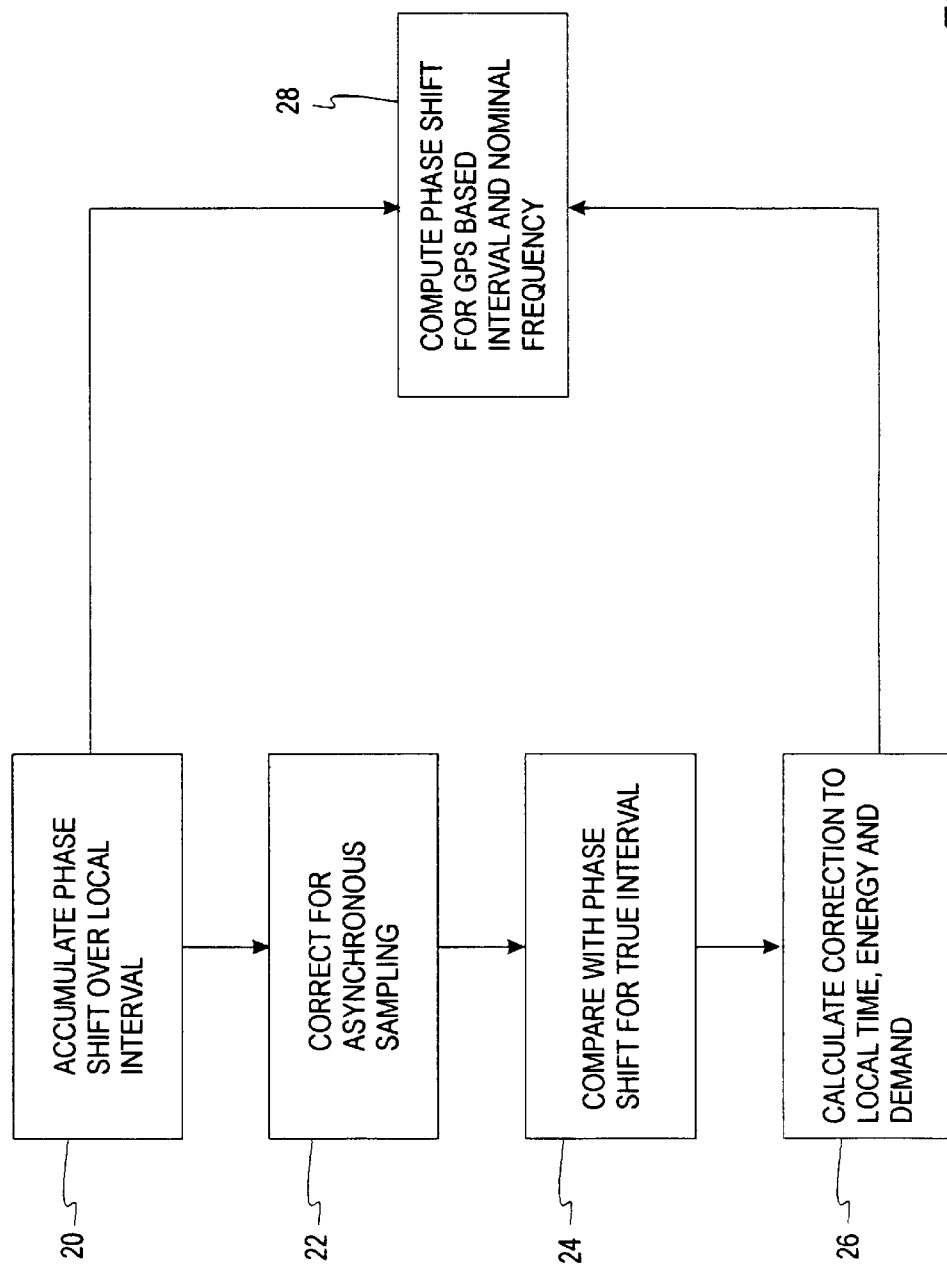
FIG. 2 illustrates another embodiment of the invention.

Referring to FIG. 2, the phase shift is accumulated over a local observation period or interval as indicated at reference numeral 20. The correction for a synchronous sampling takes place at reference numeral 22. This corrected interval is then compared with the expected phase shift for an expected or true interval as indicated at 24. The calculation to the local time or other time-based measurements is carried out at reference numeral 26. The computation of phase shift for a GPS based interval anominal power signal frequency may alternately be carried out in the embodiment of FIG. 2 as indicated at reference numeral 28.

We then compute the time correction as Tcor.=(TC×total phase shift over the local meter observation period.−True phase shift over true period)×(nominal cycle period/phase shift per cycle).

By way of example, a meter with a basic time base of 4.167500 MHz has a time resolution (or tick) of 239.952 nanoseconds. If such a system were to sample a 60 Hz waveform at 64 points per cycle, it would use 1085 time base cycles (or ticks) between samples. 64 such samples per cycle would then have an elapsed time of 16.66227 milliseconds, rather than the true period of 60 Hz wave which 16.66667 milliseconds. This would result in a correction term TC of 16.66667 milliseconds/16.66227 milliseconds or 1.00026402. The total time correction for such a meter accumulating a total phase shift of 77759980 degrees over its local 24 hour period would be determined as: T cor.={(0.01666667/0.01666227)*77759980−77760000}*{0.01666667/360}=(1.00026402*77759980−77760000*(0.01666667/360)=20509.94864 degrees*(4.62963E-05 seconds/degree)=0.9495 second. So the meter local time would be advanced by 0.9495 seconds for the 24 hour period.

While particular embodiments and applications of the present invention have been illustrated and described, it is to be understood that the invention is not limited to the precise construction and compositions disclosed herein and that various modifications, changes, and variations may be apparent from the foregoing descriptions without departing from the spirit and scope of the invention as defined in the appended claims.

We claim:

1. A method for time reference compensation in a power metering system, the method comprising:

counting cycles of incoming AC power over a predetermined local time interval;

comparing the number of cycles counted over said predetermined local time interval with the number of cycles expected; and calculating a correction to one or more of local real-time and time-based measurements of said power metering system, based on said comparing, said correction being a specific time of day that includes at least one of a specific date correction and a specific time correction.

2. The method of claim 1 and further including monitoring a precision time standard, and utilizing said precision time standard for calculating further corrections to local real-time of said power monitoring system.

3. The method of claim 1 wherein said calculating comprises multiplying any difference between the number of cycles counted and the number of cycles expected by the nominal period of the AC power.

4. A system for time reference compensation in a power metering system, the system comprising:

means for counting cycles of incoming AC power over a predetermined local time interval;

means for comparing the number of cycles counted over said predetermined local time interval with the number of cycles expected; and means responsive to said means for comparing for calculating a correction to one or more local real-time and time-based measurements of said power metering system, said correction being a specific time of day that includes at least one of a specific date correction and a specific time correction.

5. The system of claim 4 and further including means for monitoring a precision time standard, and means for utilizing said precision time standard for calculating further corrections to local real-time of said power monitoring system.

6. The system of claim 4 wherein said calculating comprises multiplying any difference between the number of cycles counted and the number of cycles expected by the nominal period of the AC power.

7. A method for time reference compensation in a power metering system, the method of comprising:

monitoring cycles of incoming AC power over a predetermined local time interval;

determining a cumulative phase shift of the power line frequency over said predetermined local time interval; and calculating a correction to one or more of local real-time and time-based measurements of said power metering system, based on a comparison of said cumulative phase shift slip over said predetermined local time interval with the phase shift for a true time interval at the nominal frequency of said AC power, said correction being a specific time of day that includes at least one of a specific date correction and a specific time correction.

8. The method of claim 7 and further including monitoring a precision time standard, and utilizing said precision time standard for calculating further corrections to local real-time of said power monitoring system.

9. The method of claim 7 wherein said determining includes measuring angular slip of the frequency of the incoming power over a period of N cycles using a discrete Fourier transform.

10. The method of claim 7 wherein said calculating includes selecting the nearest time interval within a power metering system timer resolution as a uniform sampling interval, and measuring deviations form an exact sampling interval as slip in degrees, and converting the slip in degrees to a time deviation.

11. A system for time reference compensation in a power metering system, means for the system comprising:

means for monitoring cycles of incoming AC power over a predetermined local time interval;

means for determining a cumulative phase shift of the power line frequency over said predetermined local time interval; and means for calculating a correction to one or more of local real-time and time-based measurements of said power metering system, based on a comparison of said cumulative phase shift slip over said predetermined local time interval with the phase shift for a true time interval at the nominal frequency of said AC power, said correction being a specific time of day that includes at least one of a specific date correction and a specific time correction.

12. The system of claim 11 and further including means for monitoring a precision time standard, and utilizing said precision time standard for calculating further corrections to local real-time of said power monitoring system.

13. The system of claim 11 wherein means for said determining includes means for measuring angular slip of the frequency of the incoming power using a discrete Fourier transform over a period of N cycles.

14. The method of claim 11 wherein said calculating includes selecting the nearest time interval within a power metering system timer resolution as a uniform sampling interval, and measuring deviations form an exact sampling interval as slip in degrees, and converting the slip in degrees to a time deviation.

15. A method for time reference compensation in a power metering system, the method comprising:

monitoring a time-dependent characteristic of incoming AC power over a predetermined local time interval;

comparing the monitored characteristic over said predetermined local time interval with the expected value of said characteristic based upon the nominal frequency of said AC power; and calculating a correction to one or more of local real-time and time-based measurements of said power metering system, based on said comparing, said correction being a specific time of day that includes at least one of a specific date correction and a specific time correction.

16. A system for time reference compensation in a power metering system, the system comprising:

means for monitoring a time-dependent characteristic of incoming AC power over a predetermined local time interval;

means for comparing the monitored characteristic over said predetermined local time interval with the expected value of said characteristic based upon the nominal frequency of said AC power; and means for calculating a correction to one or more of local real-time and time-based measurements of said power metering system, based on said comparing, said correction being a specific time of day that includes at least one of a specific date correction and a specific time correction.

* * * * *